(12) United States Patent
Hiruta

(10) Patent No.: US 7,822,305 B2
(45) Date of Patent: Oct. 26, 2010

(54) OPTICAL TRANSMISSION ASSEMBLY

(75) Inventor: Akihiro Hiruta, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 162 days.

(21) Appl. No.: 12/153,588

(22) Filed: May 21, 2008

(65) Prior Publication Data
US 2009/0168830 A1 Jul. 2, 2009

(30) Foreign Application Priority Data
Dec. 28, 2007 (JP) ............... 2007-340396

(51) Int. Cl.
*G02B 6/30* (2006.01)
*G02B 6/26* (2006.01)

(52) U.S. Cl. .......................... 385/49; 385/50

(58) Field of Classification Search .............. 385/49
See application file for complete search history.

(56) References Cited

U.S. PATENT DOCUMENTS

| | | | | |
|---|---|---|---|---|
| 6,690,845 | B1 * | 2/2004 | Yoshimura et al. | 385/14 |
| 6,706,546 | B2 * | 3/2004 | Yoshimura et al. | 438/31 |
| 7,541,058 | B2 * | 6/2009 | Chan et al. | 427/163.2 |

FOREIGN PATENT DOCUMENTS

| | | |
|---|---|---|
| JP | 2003-227951 | 8/2003 |
| JP | 2005-91460 | 4/2005 |
| JP | 2006-292852 | 10/2006 |

* cited by examiner

*Primary Examiner*—Charlie Peng
*Assistant Examiner*—Mary A El Shammaa
(74) *Attorney, Agent, or Firm*—McGinn IP Law Group, PLLC

(57) ABSTRACT

An optical transmission assembly consists of an upper cladding; a lower cladding; a specified width core formed between the upper cladding and the lower cladding; a surface light emitting device mounted on an upper surface of the upper cladding, a light emitting surface of the surface light emitting device facing the core; a reflective surface formed at a position in the core facing the light emitting surface of the surface light emitting device, and inclined in a longitudinal direction of the core; a shift area formed by which a beam from the light emitting surface of the surface light emitting device and the reflective surface are shifted in a width direction of the core relative to each other; and a light receiving device mounted on a lower surface of the lower cladding, a light receiving surface of the light receiving device facing the light emitting surface of the surface light emitting device through the shift area.

18 Claims, 3 Drawing Sheets

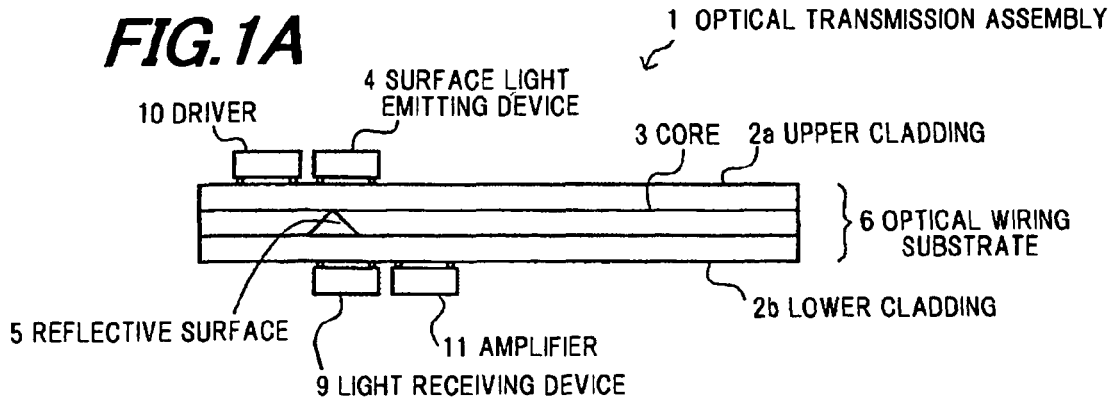
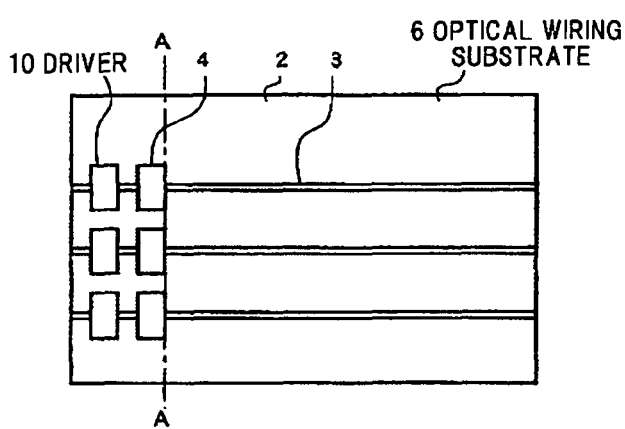
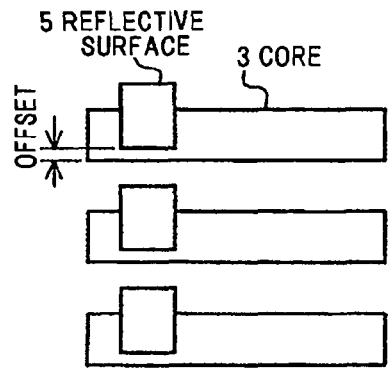
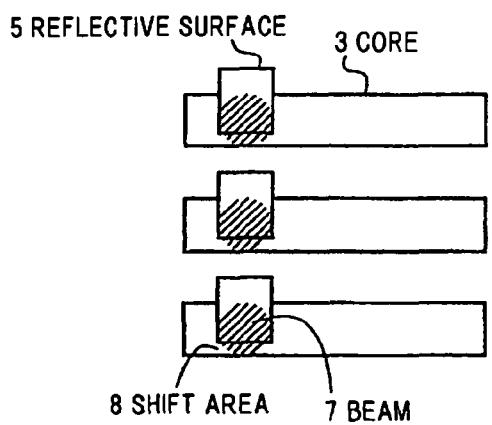
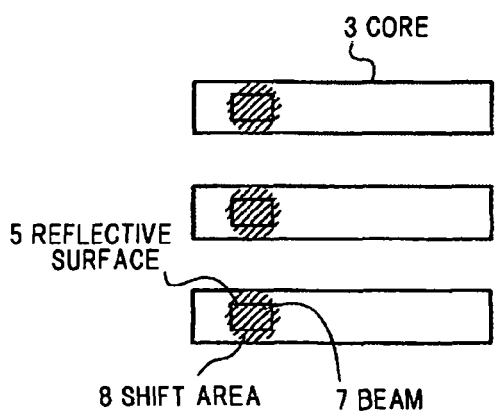

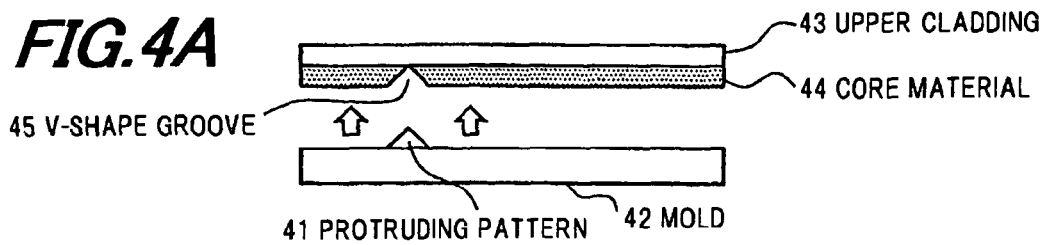
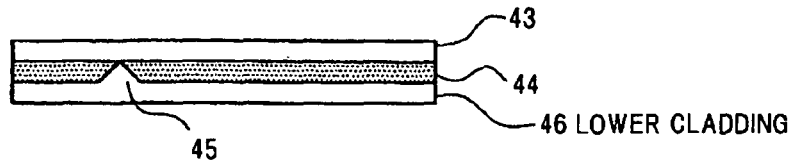
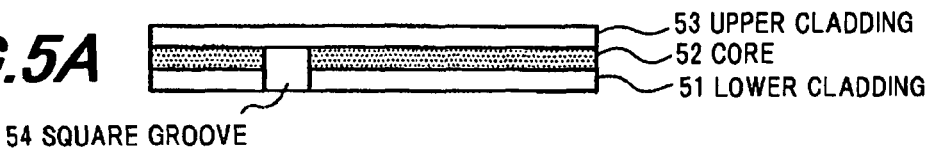
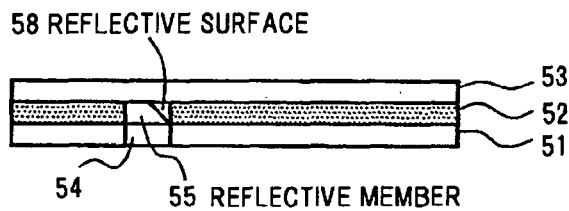
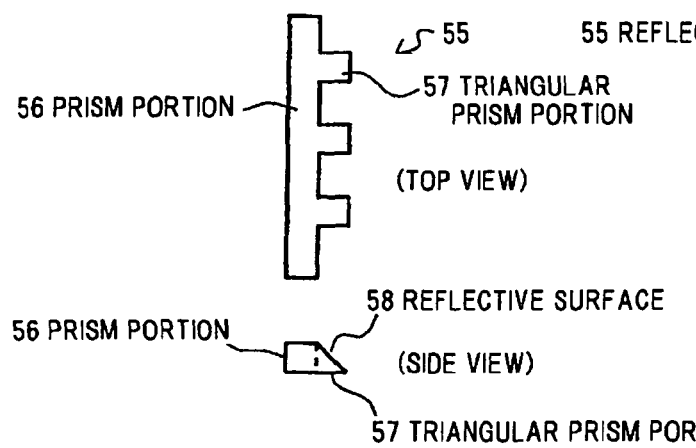
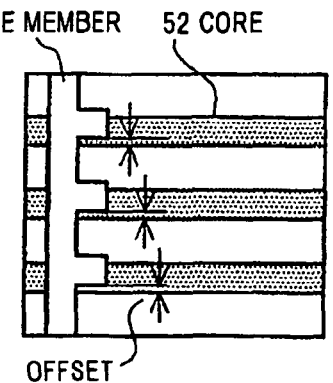

OPTICAL TRANSMISSION ASSEMBLY

The present application is based on Japanese patent application No. 2007-340396 filed on Dec. 28, 2007, the entire contents of which are incorporated herein by reference.

BACKGROUND OF THE INVENTION

1. Field of the Invention

The present invention relates to an optical transmission assembly, capable of monitoring emitted light with its simple construction.

2. Description of the Related Art

In an optical transmission assembly with a surface light emitting device mounted on an optical circuit substrate with a specified width core formed in cladding, the surface light emitting device, whose light emitting surface faces the core, is mounted on one side of the cladding, while a reflective surface is formed at a position in the core facing the light emitting surface of the surface light emitting device, and inclined in a longitudinal direction of the core. This allows light emitted from the surface light emitting device to be reflected at the reflective surface and passed to and transmitted in the core.

Also, in a light receiving side optical transmission assembly having a similar structure, a light receiving device, whose light receiving surface faces the core, is mounted on one side of the cladding, while a reflective surface is formed at a position in the core facing the light receiving surface of the light receiving device, and inclined in a longitudinal direction of the core. This allows light transmitted in the core to be reflected at the reflective surface and passed to the light receiving device.

With respect to the related art, see JP-A-2005-91460, JP-A-2006-292852, and JP-A-2003-227951.

Because surface light emitting LDs (laser diodes) such as VCSEL (vertical cavity surface emitting laser)-type LDs emits no backward light as in end face light emitting LDs such as Fabry-Perot LDs, it is impossible to realize its structure with a built-in monitor PD (photodiode) in an LD module. For this reason, VCSEL-type LDs stabilize emitted light intensity by, for example, keeping temperature constant without monitoring the emitted light intensity. However, adjusting temperature is difficult and temperature-adjusting apparatus is significantly power-consuming.

Although emitted light is considered to be forward-monitored by being branched by providing a branch, coupler, half mirror, etc. in the core, construction thereof is complicated, leading to an increase in cost and size of the optical transmission assembly.

SUMMARY OF THE INVENTION

Accordingly, it is an object of the present invention to provide an optical transmission assembly, which obviates the above problems, and which is capable of monitoring emitted light with its simple construction.

(1) According to one embodiment of the invention, an optical transmission assembly comprises:
 an upper cladding;
 a lower cladding;
 a specified width core formed between the upper cladding and the lower cladding;
 a surface light emitting device mounted on an upper surface of the upper cladding, a light emitting surface of the surface light emitting device facing the core;
 a reflective surface formed at a position in the core facing the light emitting surface of the surface light emitting device, and inclined in a longitudinal direction of the core;
 a shift area formed by which a beam from the light emitting surface of the surface light emitting device and the reflective surface are shifted in a width direction of the core relative to each other; and
 a light receiving device mounted on a lower surface of the lower cladding, a light receiving surface of the light receiving device facing the light emitting surface of the surface light emitting device through the shift area.

In the above embodiment (1), the following modifications and changes can be made.

(i) The shift area is formed by forming the reflective surface with the same width as the core, and mounting the surface light emitting device so that the light emitting center of the surface light emitting device and the center in the width direction of the core are shifted relative to each other.

(2) According to another embodiment of the invention, an optical transmission assembly comprises:
 an upper cladding;
 a lower cladding;
 a specified width core formed between the upper cladding and the lower cladding;
 a surface light emitting device mounted on an upper surface of the upper cladding, a light emitting surface of the surface light emitting device facing the core; and
 a reflective surface formed at a position in the core facing the light emitting surface of the surface light emitting device, and inclined in a longitudinal direction of the core,
 wherein the reflective surface is formed without extending across the entire width of the core, and the light emitting device is mounted facing the core.

BRIEF DESCRIPTION OF THE DRAWINGS

The preferred embodiments according to the invention will be explained below referring to the drawings, wherein:

FIGS. 1A-1E are views illustrating an optical transmission assembly in one embodiment according to the invention, FIG. 1A a side cross-sectional view, FIG. 1B a top view, FIG. 1C an enlarged top view illustrating a reflective surface, FIG. 1D an enlarged top view illustrating a shift area, and FIG. 1E an enlarged top view illustrating a shift area in another embodiment;

FIGS. 4A and 4B are views illustrating a reflective surface forming method by mounting, i.e., side cross-sectional views shown in the order of steps; and FIGS. 5A-5D are views illustrating a reflective surface forming method by fitting, FIGS. 5A and 5B side cross-sectional views shown in the order of steps, FIG. 5C top and side views illustrating a reflective member, and FIG. 5D a top view illustrating positional relationships between the reflective member and cores.

DETAILED DESCRIPTION OF THE PREFERRED EMBODIMENTS

Figure 2:
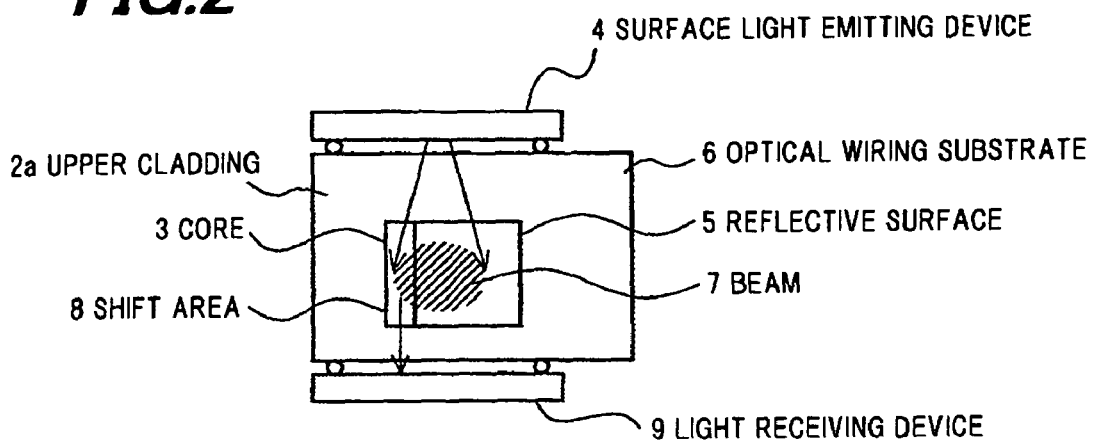
FIG. 2 is a cross-sectional view taken along line A-A in the optical transmission assembly of FIG. 1B.

As shown in FIGS. 1A and 1B, an optical transmission assembly 1 according to the invention has a core 3 with a specified thickness and a specified width viewed from top, longitudinally extended and formed between upper cladding 2a and lower cladding 2b which are shaped like a sheet. In this manner, forming the core 3 in cladding (i.e., between upper cladding 2a and lower cladding 2b) constitutes an optical circuit substrate 6. A surface light emitting device 4 is mounted on the upper surface of the upper cladding 2a and has its light emitting surface facing the core 3, while a reflective surface 5 is formed at a position in the core 3 facing the light emitting surface of the surface light emitting device 4, and inclined in a longitudinal direction of the core.

In this optical transmission assembly 1, there is formed a shift area 8 by which a beam 7 from the light emitting surface of the surface light emitting device 4 and reflective surface 5 are shifted in a width direction of the core relative to each other, while a light receiving device 9 is mounted on the lower surface of the lower cladding 2b and has its light receiving surface facing the light emitting surface of the surface light emitting device 4 through the shift area 8.

The surface light emitting device 4 is a VCSEL-type LD, for example, and is mounted on the upper surface of the upper cladding 2a and has its light emitting surface facing the upper surface of the upper cladding 2a. The upper surface of the upper cladding 2a is provided with a conductor pattern for supplying electricity to the surface light emitting device 4 and a solder pattern for mounting the surface light emitting device 4, in which the surface light emitting device 4 is surface-mounted, whose position is matched to the solder pattern. Also, the upper surface of the upper cladding 2a is mounted with a driver 10 for driving the surface light emitting device 4.

The light receiving device 9 is a PD (photodiode), for example, and is mounted on the lower surface of the lower cladding 2b and has its light receiving surface facing the lower surface of the lower cladding 2b. The lower surface of the lower cladding 2b is provided with a conductor pattern for supplying electricity to the light receiving device 9 and a solder pattern for mounting the light receiving device 9, in which the light receiving device 9 is surface-mounted, whose position is matched to the solder pattern. Also, the lower surface of the lower cladding 2b is mounted with an amplifier 11 for amplifying received light electric power of the light receiving device 9. A monitoring signal output from the amplifier 11 is preferably returned to the driver 10 via a through-hole or conductor wire not shown.

Although in the example shown, there are aligned the 3 pairs of light emitting devices 4 and drivers 10, the number or arrangement of light emitting devices 4 and drivers 10 may be arbitrary and not limited to the example shown. Also, the light receiving device 9 paired with the light emitting device 4 is mounted opposite the side mounted with the light emitting device 4.

The shift area 8 is explained in more detail. As shown in FIG. 1C, the reflective surface 5 is formed at an offset in a width direction of the core from one end in the width direction of the core 3. Because of this offset, one end in the width direction of the reflective surface 5 does not reach the one end in the width direction of the core 3. That is, the reflective surface 5 does not extend across the entire width of the core 3, so that the portion with no reflective surface 5 is left in the core 3. As explained later, the reflective surface 5 is formed at the boundary between the core 3 and a material with refractive index smaller than that of the core 3, but in the offset area, a material with refractive index smaller than that of the core 3 is not in contact with the core 3, so that only the core 3 is present.

The light emitting device 4 is mounted facing the core 3. The term "facing" means that as shown in FIG. 1D, beam 7 from the light emitting surface of the surface light emitting device 4 all goes in the width of the core 3, preferably, the center of beam 7 from the light emitting surface of the surface light emitting device 4 may be matched to the center in the width direction of the core 3. In the example shown, the core width and beam width are the same, so that beam 7 goes from one end to the other end in the width of the core 3.

Despite that beam 7 from the light emitting surface of the surface light emitting device 4 goes in the offset portion with no reflective surface 5 in the core 3 shown in FIG. 1C, no reflective surface 5 is present therein as in FIG. 1D. That is, it is the shift area 8 by which beam 7 and reflective surface 5 are shifted in the width direction of the core relative to each other. In the example shown, the core width and beam width are the same, but even when the beam width is thinner than the core width, by appropriately providing an offset from one end in the width direction of the core 3 to the reflective surface 5, the shift area 8 is formed by which beam 7 from the light emitting surface of the surface light emitting device 4 and reflective surface 5 are shifted in the width direction of the core relative to each other.

Operation of the optical transmission assembly 1 of FIGS. 1A-1E is explained with FIGS. 1A-1E and FIG. 2.

FIG. 2 is a cross-sectional view taken along line A-A in the optical transmission assembly 1 of FIG. 1B, and viewed in the longitudinal direction of the core.

As shown in FIG. 2, light emitted from the light emitting surface of the surface light emitting device 4 is transmitted in the thickness direction in the upper cladding 2a, and arrives at the reflective surface 5. Here, in FIG. 2 is conceptually shown beam 7 that is light emitted from the light emitting surface of the surface light emitting device 4 and projected on the virtual surface which is the same as the reflective surface 5. The beam 7 is present mostly in the reflective surface 5, but partially in the shift area 8. Thus, light emitted from the light emitting surface of the surface light emitting device 4 is incident mostly on the reflective surface 5, and partially on the shift area 8.

The light incident on the reflective surface 5 is reflected at the reflective surface 5, passed to the core 3, and transmitted in the longitudinal direction (perpendicular to FIG. 2) in the core 3. But, the light incident on the shift area 8 is transmitted directly through the core 3 in its thickness direction to the lower cladding 2b. The light passed to the lower cladding 2b is emitted from the lower surface of the lower cladding 2b, and arrives at the light receiving surface of the light receiving device 9.

As seen from FIG. 2, a specified part of the light emitted by the surface light emitting device 4 is incident on the light receiving device 9. Thus, a monitoring signal into which the received light electric power of the light receiving device 9 is amplified by the amplifier 11 with a specified gain, is proportional to the emitted light intensity of the surface light emitting device 4. Therefore, by returning this monitoring signal to the driver 10, it is possible to stabilize the emitted light intensity of the surface light emitting device 4.

As above, according to this invention, since the shift area 8 is formed by which beam 7 from the light emitting surface of the surface light emitting device 4 and reflective surface 5 are shifted in the width direction of the core relative to each other, while the light receiving device 9 is mounted on the lower surface of the lower cladding 2b and has its light receiving surface facing the light emitting surface of the surface light emitting device 4 through the shift area 8, it is possible to monitor the light emitted through the shift area 8.

Conventionally, there is provided no offset for causing all light emitted from the surface light emitting device to be reflected at the reflective surface and passed to the core, whereas in the present invention, the offset is provided (i.e., the core 3 width is larger than the reflective surface 5 width)

so that emitted light is partially transmitted through to the lower cladding 2b. This allows emitted light to be monitored with the simple construction without adding a special optical member or complicatedly modifying the core or cladding.

Although in this embodiment, the shift area 8 is formed by providing the offset so that the reflective surface 5 does not extend across the entire width of the core 3, and mounting the surface light emitting device 4 facing the core 3, the shift area may be formed by forming the reflective surface 5 with the same width as the core 3, and mounting the surface light emitting device 4 so that the light emitting center of the surface light emitting device 4 and the center in the width direction of the core 3 are shifted relative to each other. In this case, the shift area is formed in the upper cladding 2a, but light incident in the thickness direction of the upper cladding 2a is transmitted in that direction, as in the case that the shift area 8 is formed in the core 3.

As another structure, reflective surface 5 width may be formed smaller than core 3 width (see FIG. 1E). This allows most (e.g., the order of 90%) of light emitted from the surface light emitting device 4 to be reflected at the reflective surface 5 and transmitted in the core 3. But, since the reflective surface 5 is smaller than beam 7 width (=core width), part of light is transmitted through the core 3, and further through the lower cladding 2b and is received by the light receiving device 9.

Next is explained a reflective surface forming method.

FIGS. 3A-3E illustrate a reflective surface forming method by photo-etching.

Figure 3A:
FIGS. 3A-3E are views illustrating a reflective surface forming method by photo-etching, i.e., side cross-sectional views shown in the order of steps.
Figure 3B:
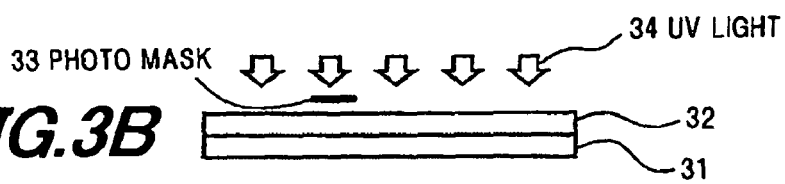
Figure 3C:
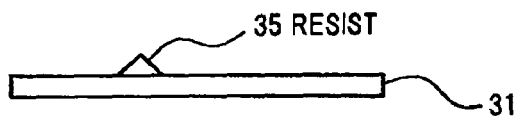
Figure 3D:
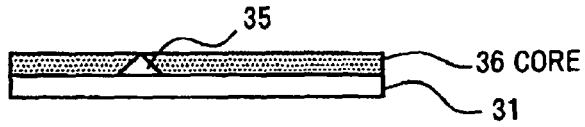
Figure 3E:
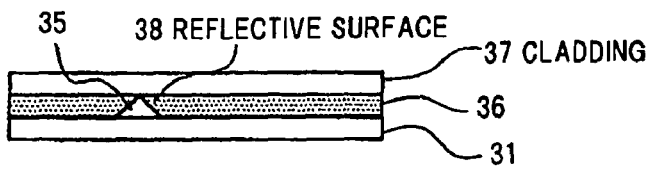

As shown in FIG. 3A, over one entire side of a substrate 31 is formed a specified thickness resist film 32. As shown in FIG. 3B, a photo mask 33 with a desired pattern (herein, a rectangle equal to a top view of the reflective surface) is placed in a desired area on the resist film 32, which is irradiated with UV light 34 from thereabove for resist film 32 exposure. As shown in FIG. 3C, the photo mask 33 is removed, and exposed portion of the resist film 32 is removed with a solvent, so that a resist 35 is left in the area in which the photo mask 33 of the substrate 31 is placed. As shown in FIG. 3D, a core material is applied on the substrate 31 to form a core 36. The core 36 has substantially the same thickness as the resist 35. This allows the resist 35 to be present at an intermediate position in the longitudinal direction of the core 36 so that the boundary between the core 36 and the resist 35 is inclined in the longitudinal direction of the core. Finally, as shown in FIG. 3E, over the core 36 is formed cladding 37. Making the refractivity of the resist 35 smaller than the refractivity of the core 36 allows the boundary between the resist 35 and the core 36 to serve as a reflective surface 38.

In this invention, the area for placing the photo mask 33 is offset in the width direction of the core to the area for forming the core 36, thereby producing optical transmission assembly 1 with shift area 8 shown in FIG. 1.

FIGS. 4A and 4B illustrate a reflective surface forming method by mounting.

As shown in FIG. 4A, mold 42 with protruding pattern 41 is made. Core material 44 is applied to upper cladding 43. The mold 42 is pressed against the core material 44, so that only portion of core material 44 that is matched to the protruding pattern 41 is removed, to form a V-shape groove 45. Subsequently, the member shown in FIG. 4A is rotated through 180 degrees so that the V-shape groove 45-formed side of the core is the upper side, while the upper cladding 43 is the lower side. Cladding material is applied to the V-shape groove 45-formed side of the core, to form lower cladding 46.

In this invention, the protruding pattern 41-formed area is offset in the width direction of the core to the core material 44-applied area, thereby producing optical transmission assembly 1 with shift area 8 shown in FIG. 1.

FIGS. 5A-5D illustrate a reflective surface forming method by fitting.

As shown in FIG. 5A, lower cladding 51, core 52, and upper cladding 53 are formed beforehand. A square groove 54 is diced in a reflective surface formed area that has a depth from the lower cladding 51 to the upper cladding 53. As shown in FIG. 5B, a reflective member 55 separately made is fitted in the square groove 54. Here, as shown in FIG. 5C, the reflective member 55 comprises an integral member of prism portion 56 extending in the width direction of the core and triangular prism portion (in FIG. 5C, 3 triangular prism portions) 57 provided on one side of the prism portion 56 and in the longitudinal direction of the core. The triangular prism portion 57 has a reflective surface 58 inclined in the longitudinal direction of the core. Thus, as in FIG. 5B, by fitting the reflective member 55 in the square groove 54, it is possible to form the reflective surface 58 in the core 52 that is inclined in the longitudinal direction of the core.

In this invention, as shown in FIG. 5D, the triangular prism portions 57 are provided with offsets for 3 cores 52 respectively, thereby producing optical transmission assembly 1 with shift area 8 shown in FIG. 1.

As one example of the optical circuit substrate, a multi-mode waveguide structure is preferable because it facilitates axial alignment of the core and the light emitting/receiving device. In this case, the width and height of the core are set to 50-100 μm. Also, the relative refractive index difference is preferably on the order of 0.3% because of excellent optical coupling properties with optical fibers.

Used as the core material and cladding material is preferably optically transparent polymeric flexible materials such as polymers because of enhancement in degree of freedom of wiring.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An optical transmission assembly, comprising:
   an upper cladding;
   a lower cladding;
   a specified width core formed between the upper cladding and the lower cladding;
   a surface light emitting device mounted on an upper surface of the upper cladding, a light emitting surface of the surface light emitting device facing the core;
   a reflective surface formed at a position in the core facing the light emitting surface of the surface light emitting device, and inclined in a longitudinal direction of the core;
   a shift area formed in which a beam from the light emitting surface of the surface light emitting device is relatively shifted from the reflective surface in a width direction of the core; and
   a light receiving device mounted on a lower surface of the lower cladding, a light receiving surface of the light receiving device facing the light emitting surface of the surface light emitting device through the shift area,
   wherein the beam from the light emitting surface of the surface light emitting device that passed through the shift area is transmitted through the lower cladding and received at the light receiving device.

2. The optical transmission assembly according to claim 1, wherein the reflective surface is formed having a width that is equal to a width of the core, and
wherein the surface light emitting device is mounted so that a light-emitting center of the surface light emitting device and a center in the width direction of the core are shifted relative to each other.

3. The optical transmission assembly according to claim 1, wherein the beam of the light emitting surface of the surface light emitting device is unbranched.

4. The optical transmission assembly according to claim 1, wherein the shift area is provided by other than a branching of light by a Y-branch divider.

5. The optical transmission assembly according to claim 1, wherein the beam from the light emitting surface of the surface light emitting device comprises:
a first beam part that is reflected in the longitudinal direction of the core by the reflective surface; and
a second beam part that passes through the core without reflection by the reflective surface to be transmitted through the lower cladding and received at the light receiving device.

6. The optical transmission assembly according to claim 1, wherein ends of the reflective surface in the width direction of the reflective surface are unaligned with ends of the core in the width direction of the core.

7. The optical transmission assembly according to claim 6, wherein a width of the reflective surface in the width direction of the reflective surface is equal to a width of the core in the width direction of the core.

8. An optical transmission assembly, comprising:
an upper cladding;
a lower cladding;
a specified width core formed between the upper cladding and the lower cladding;
a surface light emitting device mounted on an upper surface of the upper cladding, a light emitting surface of the surface light emitting device facing the core;
a reflective surface formed at a position in the core facing the light emitting surface of the surface light emitting device, and inclined in a longitudinal direction of the core; and
a light receiving device mounted on a lower surface of the lower cladding, a light receiving surface of the light receiving device facing the light emitting surface of the surface light emitting device,
wherein the reflective surface is formed without extending across the entire width of the core, and the light emitting device is mounted facing the core, and
wherein a part of a beam from the light emitting surface of the surface light emitting device that is incident on a region other than the reflective surface is transmitted through the lower cladding and received at the light receiving device.

9. An optical transmission assembly, comprising:
a surface light emitting device mounted on an upper surface of an upper cladding, the surface light emitting device comprising a light emitting surface that emits a beam;
a core formed between the upper cladding and a lower cladding, the core comprising:
a reflective surface formed at a position facing the light emitting surface of the surface light emitting device, and inclined in a longitudinal direction of the core to reflect a first portion of the beam of the light emitting surface in the longitudinal direction; and
a shift area formed at a position between an end of the core in a width direction of the core and an end of the reflective surface in the width direction of the reflective surface, the shift area allowing a second portion of the beam to be transmitted through the core and the lower cladding; and
a light receiving device mounted on a lower surface of the lower cladding, the light receiving device comprising a light receiving surface that faces the light emitting surface of the surface light emitting device through the shift area, the light receiving surface receiving the second portion of the beam transmitted through the core and the lower cladding via the shift area.

10. The optical transmission assembly according to claim 9, wherein a width of the reflective surface is equal to a width of the core.

11. The optical transmission assembly according to claim 9, wherein the beam includes the first portion and the second portion of the beam.

12. The optical transmission assembly according to claim 9, further comprising:
an optical wiring substrate, comprising the upper cladding, the core, and the lower cladding,
wherein the second portion of the beam is transmitted through the optical wiring substrate to the light receiving surface without diversion.

13. The optical transmission assembly according to claim 9, wherein the first portion of the beam and the second portion of the beam are defined by the end of the reflective surface in the width direction of the reflective surface.

14. The optical transmission assembly according to claim 9, wherein an opposite end of the reflective surface in the width direction of the reflective surface overlaps an opposite end of the core in the width direction of the core.

15. The optical transmission assembly according to claim 9, wherein an entirety of the beam is transmitted through the upper cladding.

16. The optical transmission assembly according to claim 9, wherein only the second portion of the beam is transmitted through the lower cladding.

17. The optical transmission assembly according to claim 9, wherein the light receiving surface only receives the second portion of the beam.

18. The optical transmission assembly according to claim 9, wherein the second portion of the beam is allowed without diversion to travel from the light emitting surface to the light receiving surface.

* * * * *